(12) United States Patent
Maher et al.

(10) Patent No.: US 6,214,119 B1
(45) Date of Patent: *Apr. 10, 2001

(54) VACUUM SUBSTRATE PROCESSING SYSTEM HAVING MULTIPLE PROCESSING CHAMBERS AND A CENTRAL LOAD/UNLOAD CHAMBER

(75) Inventors: Joseph A. Maher, South Hamilton, MA (US); E. John Vowles, Goffstown; Joseph D. Napoli, Winham, both of NH (US); Arthur W. Zafiropoulo, Manchester; Mark W. Miller, Burlington, both of MA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/195,749

(22) Filed: Nov. 18, 1998

Related U.S. Application Data

(62) Division of application No. 08/453,060, filed on May 26, 1995, which is a continuation of application No. 08/276,218, filed on Jul. 15, 1994, now abandoned, which is a continuation of application No. 07/809,031, filed on Dec. 16, 1996, now Pat. No. 5,344,542, which is a continuation of application No. 07/456,036, filed on Dec. 22, 1989, now abandoned, which is a continuation of application No. 06/853,775, filed on Apr. 18, 1986, now abandoned.

(51) Int. Cl.$^7$ .................................................. C23C 16/00
(52) U.S. Cl. ....................................... 118/719; 118/723 R
(58) Field of Search ................................ 118/719, 723 R; 414/935, 936, 937, 938, 939

(56) References Cited

U.S. PATENT DOCUMENTS 4,592,306  6/1986  Gallego ............................... 118/719
4,661,196  4/1987  Hockersmith et al. ............... 156/345

(List continued on next page.)

FOREIGN PATENT DOCUMENTS 57-149748  3/1981  (JP) .............................. H01L/21/68

*Primary Examiner*—Jeffrie R. Lund
*Assistant Examiner*—Sylvia R. MacArthur
(74) *Attorney, Agent, or Firm*—Charles S. Guenzer

(57) ABSTRACT

The present invention includes plural plasma processing vessels and a wafer queuing station arrayed with a wafer transfer arm in a controlled environment. Wafers are movable within the controlled environment one at a time selectably between the several plasma vessels and the wafer queuing station without atmospheric or other exposure so that possible contamination of the moved wafers is prevented. The system is selectively operative in either single-step or multiple-step processing modes, and in either of the modes, the several plasma etching vessels are operable to provide a desirably high system throughput. In the preferred embodiment, the several plasma vessels and the queuing station are arrayed about a closed pentagonal locus with the wafer transfer arm disposed within the closed locus. The wafer transfer arm is movable in R and Θ between the several plasma etching vessels and the wafer queuing station, and selectably actuatable vacuum locks are provided between each of the plasma etching vessels and the R and Θ movable wafer transfer arm to both maintain an intended atmospheric condition and to allow wafer transport therethrough. The plasma vessels each include first and second water-cooled electrodes that are movable relatively to each other so as to provide a selectable gap dimension therebetween. One of the electrodes includes a selectively movable pedestal portion slidably mounted thereto that is cooperative with the R and Θ movable wafer transfer arm to load and unload wafers respectively into and out of the associated plasma vessel. The wafer transfer arm is operative to pick-up the wafers by back-side and peripheral wafer contact only, which therewith prevents possible front-side contact-induced contamination of the wafer surfaces. A sensor on the transfer arm is operative to provide a signal indication of proper wafer seating.

13 Claims, 12 Drawing Sheets

U.S. PATENT DOCUMENTS

| | | | | |
|---|---|---|---|---|
| 4,715,921 | * | 12/1987 | Maher et al. | 156/345 |
| 4,836,905 | * | 6/1989 | Davis et al. | 118/719 |
| 4,923,584 | * | 5/1990 | Bramhall, Jr. et al. | 118/719 |
| 5,013,385 | * | 5/1991 | Maher et al. | 156/345 |
| 5,102,495 | * | 4/1992 | Maher et al. | 216/67 |
| 5,292,393 | * | 3/1994 | Maydan et al. | 118/729 |
| 5,308,431 | * | 5/1994 | Maher et al. | 156/345 |
| 5,344,542 | * | 9/1994 | Maher et al. | 118/729 |
| 5,512,320 | * | 4/1996 | Turner et al. | 118/719 |
| 5,611,861 | * | 3/1997 | Higashi | 118/719 |

* cited by examiner

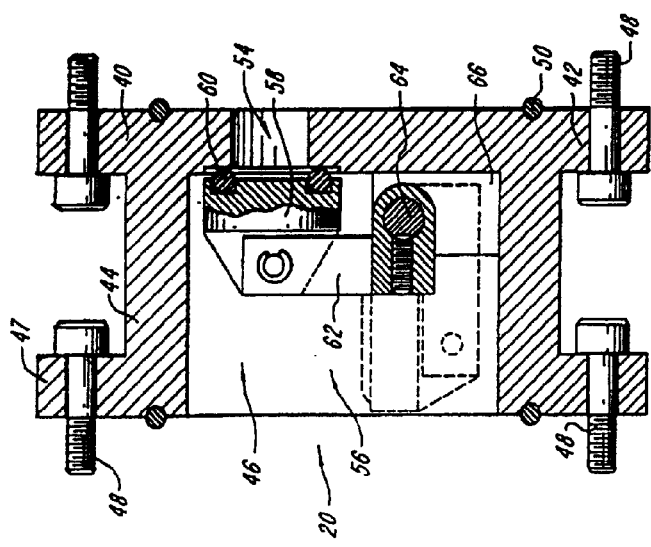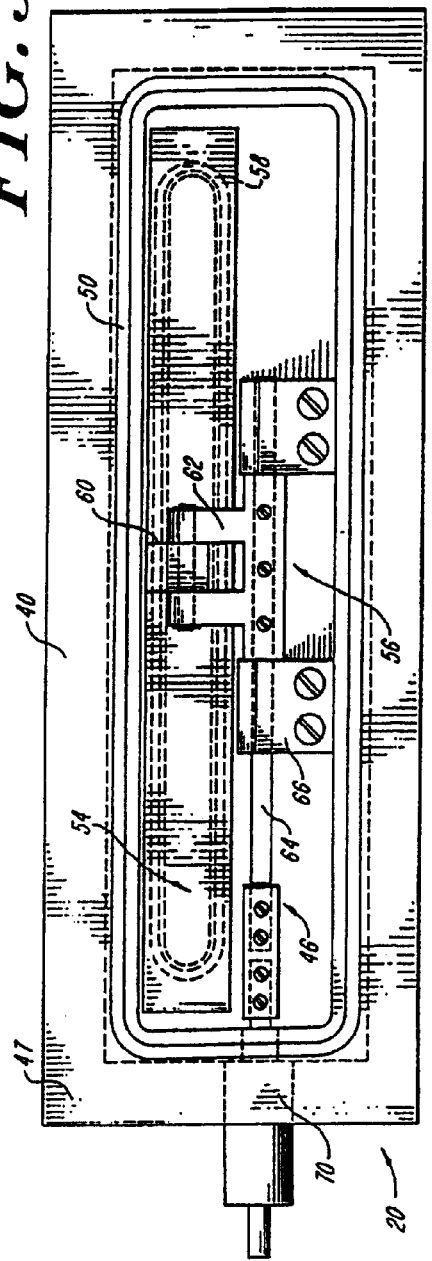

VACUUM SUBSTRATE PROCESSING SYSTEM HAVING MULTIPLE PROCESSING CHAMBERS AND A CENTRAL LOAD/UNLOAD CHAMBER

RELATED APPLICATION

This application is a divisional of Ser. No. 08/453,060, filed May 26, 1995, which is a continuation of Ser. No. 08/276,218, filed Jul. 15, 1994, now abandoned which is a continuation of Ser. No. 07/809,031, filed Dec. 16, 1996 and now issued as U.S. Pat. No. 5,344,542, which is a continuation of Ser. No. 07/456,036, filed Dec. 22, 1989, now abandoned which is a continuation of Ser. No. 06/853,775, filed Apr. 18, 1986 now abandoned.

FIELD OF THE INVENTION

This invention is directed to the field of semiconductor processing, and more particularly, to a novel multiple-processing and contamination-free plasma etching system.

BACKGROUND OF THE INVENTION

Plasma processing devices are commonly employed during one or more of the phases of the integrated circuit fabrication process, and are typically available in either a single-wafer or a plural-wafer configuration. The single-wafer configurations, while providing excellent process control, suffer from a restricted system throughput capability. Efforts to relieve the throughput limitations, such as those that have employed faster but higher-temperature processes, have been generally unsuccessful. For these higher-temperature processing processes, system utility is limited due to the undesirable phenomenon of resist "popping", notwithstanding that various cooling approaches have been used including clamping, cooling of the wafer underside with a helium flow, and the mixing of helium into the plasma. The multiple-wafer configurations, while providing a comparatively much-greater system throughput, have been generally subject to less-than-desirable process and quality control. Not only are end-point determinations for each of the multiple wafers either not available or not precisely determinable, but also electrode positional accuracy for different electrode gaps and correspondingly different gas chemistries is often difficult to establish and maintain. The single-wafer and the multiple-wafer configurations are both subject to the further disadvantage that two or more step processes typically expose the wafers to an undesirable environment in the intermediate handling step, which materially increases the possibility of wafer contamination, and which further restricts the processing throughput.

SUMMARY OF THE INVENTION

The present invention contemplates plural single-wafer plasma reactors each operative individually to provide excellent process control of single wafers, collectively operative to provide a system throughput limited only by the number of the plural plasma reactors, and so cooperative with a common wafer transfer and queuing means as to provide both single-step and multiple-step wafer processing in a manner that neither exposes the wafers to an undesirable atmosphere nor to human handling.

In the preferred embodiment, plural plasma reactors and a cassette elevator are symmetrically arrayed about an X, Θ movable wafer arm assembly. The plural reactors, the cassette elevator, and the X, Θ movable wafer arm are maintained in a controlled vacuum condition, and the central X, Θ movable wafer arm is in radial communication with the peripherally surrounding plasma reactors and cassette elevator via a corresponding one of a plurality of vacuum lock valves. The arm of the R, Θ movable wafer arm assembly includes an apertured platform for supporting each wafer, and a cooperative bumper for releasably engaging the back and the periphery of the supported wafer without any wafer front surface contact. Plural wafer contact responsive sensors mounted to the platform are operative to provide a signal indication of whether or not the wafer is in a properly seated condition. Each of the plural plasma reactors includes a stationary bottom electrode and a movable upper electrode that are cooperative to provide a variable wafer-cathode to anode gap therebetween of a selectable dimension. In one embodiment, a support assembly including a micrometer adjustment stop is provided for selectively positioning the movable electrode, and in another embodiment, a combination micrometer stop and pneumatic actuators are provided for selectively positioning the movable electrode. A vertically movable pedestal is slidably mounted centrally to the stationary electrode of each of the plural plasma reactors that cooperates with the apertured platform of the R, Θ movable wafer arm assembly to load and unload the wafers respectively onto and off of the stationary electrode. A reactant gas injection system, a RF power source, and an end-point determination means are operatively coupled to each of the plural plasma reactors. The plural plasma reactors are operable in either embodiment to run the same or different processes, and are cooperative with the R, Θ movable wafer arm assembly to provide one of the same single-step processing simultaneously in the plural plasma reactors, different single-step processing simultaneously in the plural plasma reactors, and sequential two or more step processing in the plural reactors. Two embodiments of the R, Θ movable wafer arm assembly are disclosed.

BRIEF DESCRIPTION OF THE DRAWINGS

These and other features, and advantages, of the present invention will become apparent as the invention becomes better understood by referring to the following solely-exemplary and non-limiting detailed description of the preferred embodiments thereof, and to the drawings, wherein:

FIG. 3 illustrates in FIG. 3A and in FIG. 3B partially schematic side and end elevational views respectively illustrating the vacuum locks intermediate a corresponding plasma reactor and the R, Θ movable arm assembly of the multiple-processing and contamination-free plasma etching system according to the present invention;

DETAILED DESCRIPTION OF THE PREFERRED EMBODIMENT

Figure 1:
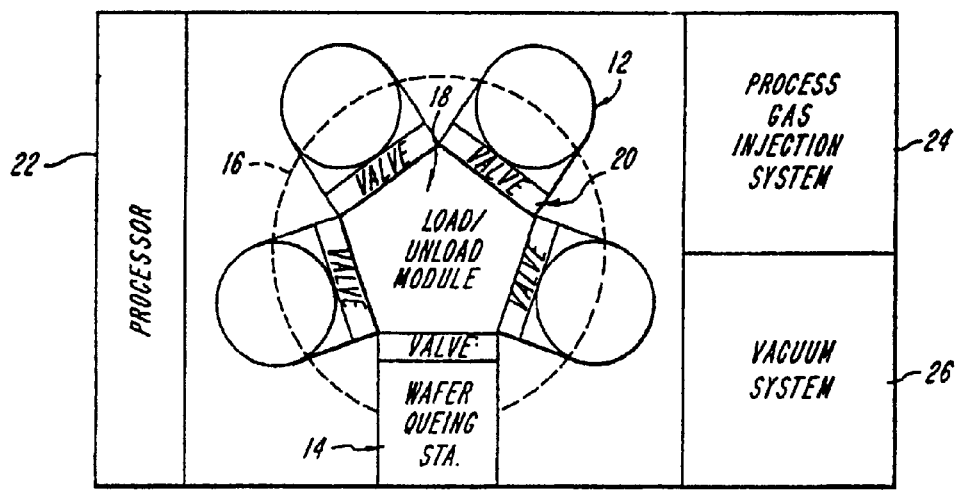
FIG. 1 is a pictorial diagram illustrating the multiple-processing and contamination-free plasma processing system according to the present invention.

Referring now to FIG. 1, generally designated at 10 is a pictorial diagram illustrating the multiple-processing and contamination-free plasma etching system according to the present invention. The system 10 includes a plurality of single-wafer plasma reactors generally designated 12 to be described and a wafer queuing station generally designated 14 to be described that are arrayed about a closed locus as illustrated by a dashed line 16. A load/unload module generally designated 18 to be described is disposed concentrically within the plural plasma reactors 12 and the queuing station 14 for singly transferring wafers to be processed and after processing between the queuing station 14 and one or more of the plasma reactors 12. A plurality of vacuum locks generally designated 20 to be described are individually provided at the interfaces of the several plasma reactors 12 and the load and unload module 18, and between the interface of the queuing station 14 and the load and unload module 18. A processor 22 is operatively coupled to the plural plasma reactors 12, to the queuing station 14, and to the load and unload module 18 for activating and de-energizing radio frequency plasma inducing fields in well-known manner, for controlling and processing in well-known manner the signal output of end-point determination means coupled to the several plasma reactors, and for initiating and coordinating wafer transfer between the several reactors and the queuing station to be described.

A reactant gas injection system 24 to be described is operatively coupled to the plural plasma reactors 12 for controllably injecting preselected reactants and other process gases severally into the plural plasma reactors. A vacuum system 26 is operatively coupled to the reactors 12, to the queuing station 14, and to the load and unload module 18 for maintaining the entire assembly at a controlled vacuum condition during operation. The processor 22 is operatively coupled to the reactant gas injection system and to the vacuum system 26.

The several reactors 12, the queuing station 14, and the concentric load and unload module 18 conserve space utilization and in such a way as to provide a comparatively-compact plasma etching system. The load and unload module 18 and cooperative ones of the vacuum locks 20 are operable to transfer wafers singly between the queuing station 14 and selected reactors 12 in a single-step processing mode and between selected reactors 12 in a two or more step processing mode without any residual or environmentally-induced wafer contamination as well as without intermediate operator handling. Among other additional advantages, the plasma etching system of the present invention is characterized by both an excellent process control and a high processing throughput, the mutual co-existence of both features having not heretofore been possible in a practicable embodiment.

Figure 2:
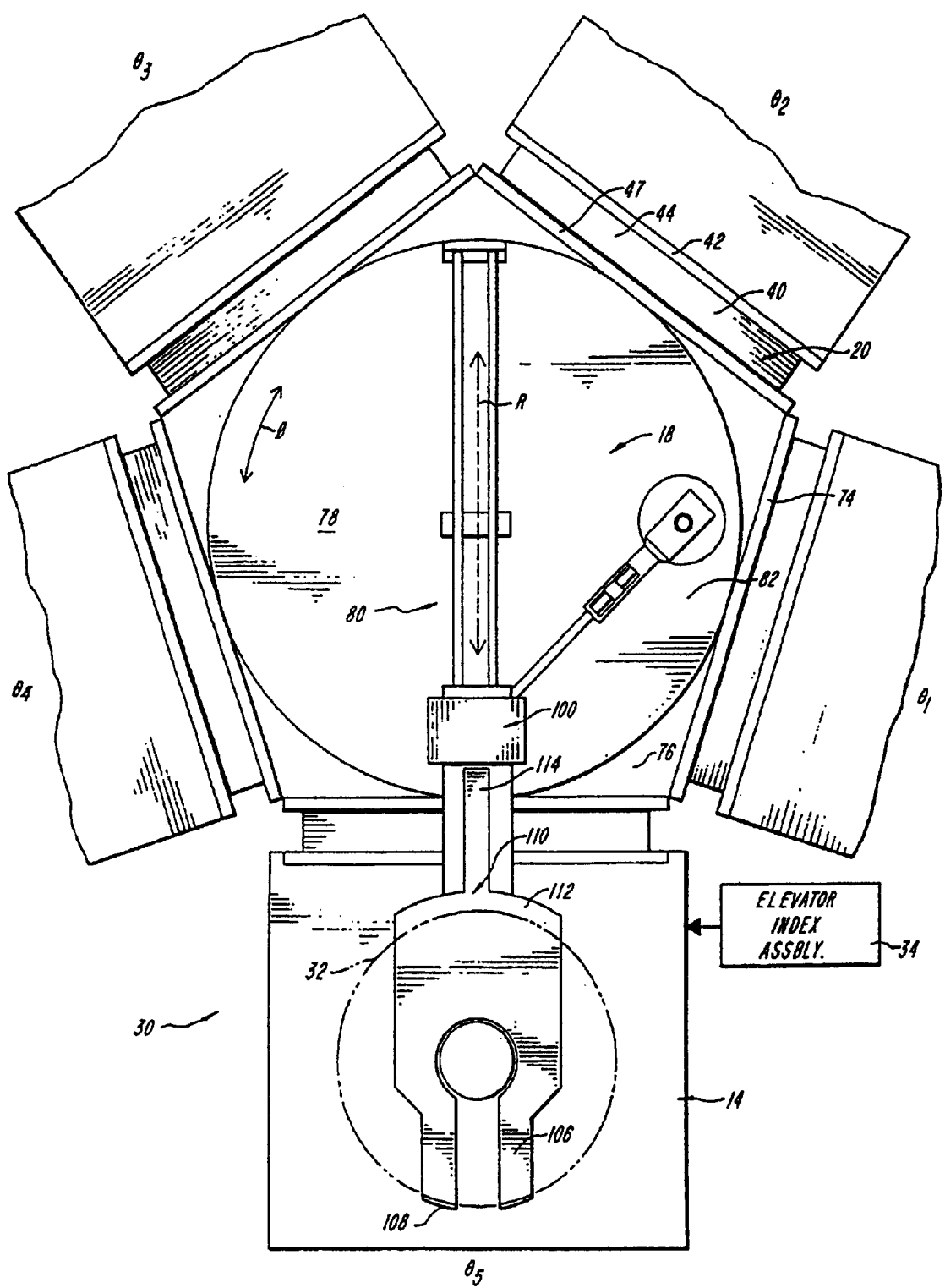
FIG. 2 is a fragmentary plan view, partially broken away, of the multiple-processing and contamination-free plasma etching system according to the present invention.

Referring now to FIG. 2, generally designated at 30 is a fragmentary plan view, partially broken-away, illustrating the multiple-processing and contamination-free plasma etching system of the present invention. The queuing station 14 preferably includes a cassette, not shown, having plural vertically-spaced wafers 32 stacked therein. The cassette is preferably mounted for vertical stepping motion by an indexed elevator assembly schematically illustrated at 34, that is operable under control of the processor 22 (FIG. 1) to step the cassette in vertical increments that correspond to the spacing of the vertically spaced wafers for addressing the associated cassette slot position. It will be appreciated that in this way individual wafers in the cassette are addressed for removal for processing and for return after processing to their corresponding slot positions. It should be noted that although a cassette and indexed elevator assembly are presently preferred, any other suitable wafer queuing station can be employed as well without departing from the inventive concept.

Referring now to FIGS. 2, 3A and 3B, the vacuum locks 20 intermediate the queuing station 14 and the load/unload module 18 and intermediate the plural plasma reactors 12 and the load and unload station 18 each include a housing body generally designated 40. The housing 40 includes a plate 42 having opposing top, bottom, and side walls 44 orthogonal thereto that cooperate to define a generally-rectangular hollow generally designated 46 therewithin as best seen in FIG. 3A. A flange 47 is provided peripherally around the walls 44 on the ends thereof remote from the plate 42, and bolts 48 are provided through the ends of the plate 42 and of the flange 47 for fastening the housing body 40 at the interfaces between corresponding ones of the plasma reactors 12 and the load and unload station 18 and between the interface between the queuing station 14 and the load and unload station 18. O-rings 50 are provided on the sealing faces of the plate 42 and flange 47 for providing an air-tight seal. An elongated slot generally designated 54 is provided through the plate 47 that is in communication with the generally-rectangular hollow 46.

A chamber door assembly generally designated 56 is cooperative with the slot 54 to provide a valving action. The door assembly 56 includes an elongated, generally-rectangular plate 58 of dimensions selected to be larger than the dimensions of the slot 54. An O-ring sealing member 60 is provided in the sealing face of the plate 58 and surrounding the slot 54. The plate 58 is fastened to an arm 62 that is mounted for rotary motion with a shaft 64 journaled in spaced bearings 66 that are fastened to the plate 42. A chamber door Θ-drive actuator, not shown, is fastened to the shaft 64 through an edge of the housing 40 preferably via a ferrofluidic or other rotary seal as illustrated dashed at 70.

The chamber door 56 is pivoted by the chamber door Θ-drive actuator between an open condition, illustrated in dashed outline in FIG. 3A, and a closed condition, illustrated in solid outline in FIGS. 3A and 3B. In its open condition, the generally rectangular hollow 46 is in open communication with the elongated slot 54, so that a wafer arm assembly to be described may readily be moved therethrough between the load and unload station 18 and the several plasma reactors 12 and queuing station 14. In the closed condition of the door assembly 56, the load and unload module is sealed from the plural plasma reactors 12 and from the queuing station 14.

Figure 4:
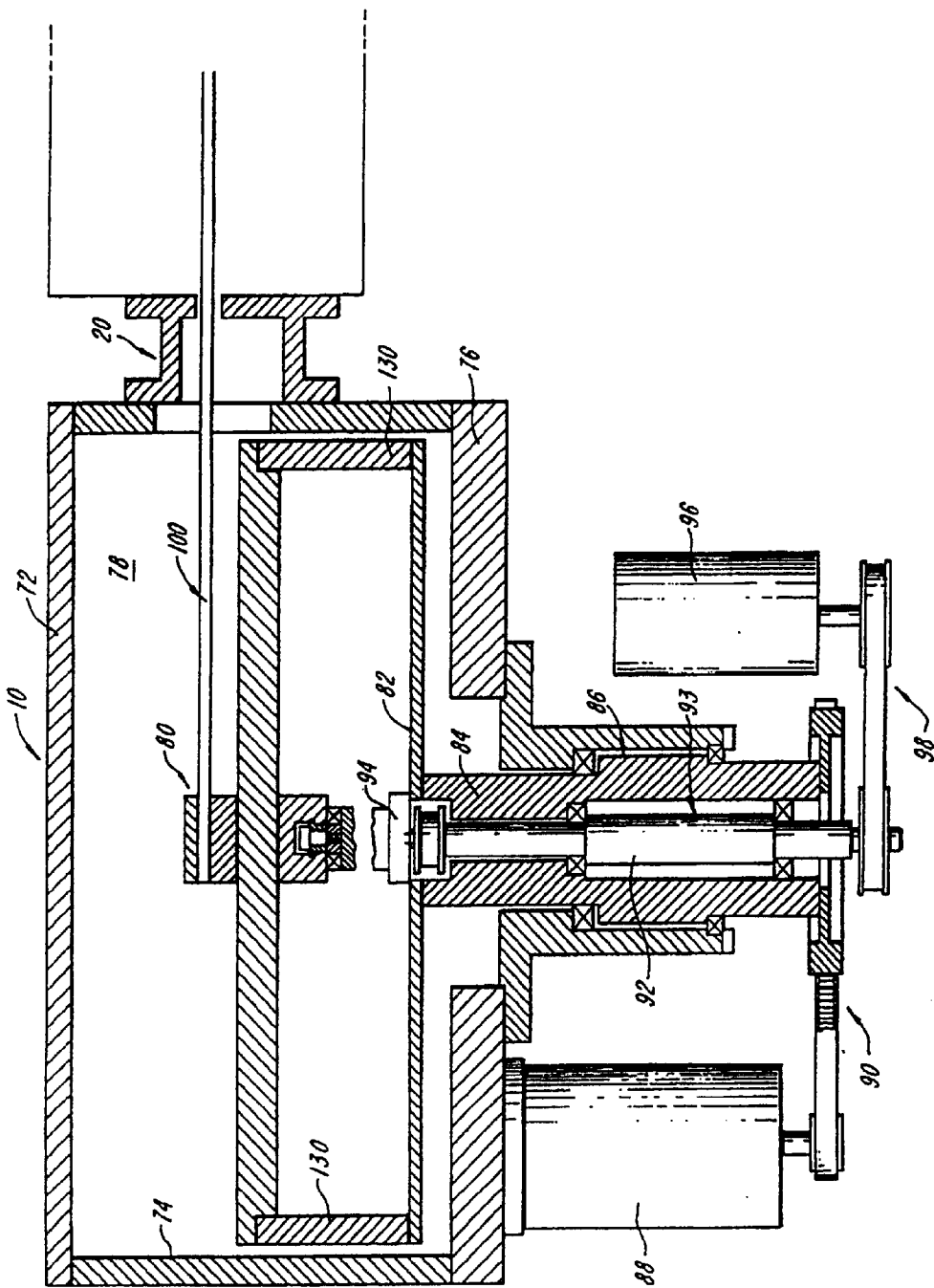
FIG. 4 is a partially pictorial and partially sectional view useful in explaining the operation of the R, Θ movable wafer arm assembly of the multiple-processing and contamination-free plasma etching system according to the present invention.

Referring now to FIGS. 2 and 4, the load and unload module 18 includes a top wall 72, pentagonally-arranged side walls 74, and a pentagonal bottom wall 76 defining an enclosure generally designated 78. A R, Θ movable wafer arm assembly generally designated 80 to be described is mounted in the enclosure 78. The assembly 80 includes a turntable 82 mounted for Θ-rotation with a shaft 84 journaled in a bearing assembly generally designated 86 that is fastened in a central aperture provided therefor in the bottom wall 76. A Θ drive motor 88 mounted to the bottom wall 76 is operatively coupled to the shaft 84 via a belt and wheel arrangement generally designated 90. With controlled rotation of the shaft of the Θ-motor 88, the shaft 84 and therewith the turntable 82 rotates to any selected angular Θ orientation for aligning the wafer arm assembly 80 with any one of the plasma reactors 12 or with the queuing station 14 at the corresponding $\Theta_1$, $\Theta_2$, $\Theta_3$, $\Theta_4$, and $\Theta_5$ coordinates.

A shaft 92 is concentrically mounted within the shaft 84 and journaled for rotation therein on a bearing and vacuum seal assembly generally designated 93. Any suitable rotary vacuum seal, such as a ferrofluidic rotary vacuum seal, may be employed. One end of the shaft 92 is connected to a pivot bearing 94 to be described vacuum-mounted through the turntable 82, and the other end of the shaft 92 is operatively coupled to a R-drive motor 96 via a belt and wheel arrangement generally designated 98. As described more fully below, with the controlled rotation of the shaft of the R-drive motor 96, the wafer arm of both embodiments of the R, Θ movable wafer arm assembly to be described is controllably translated in the R-direction for loading and unloading individual wafers into and out of the plural reaction chambers 12 and queuing station 14 through the associated vacuum lock 20.

Figure 5:
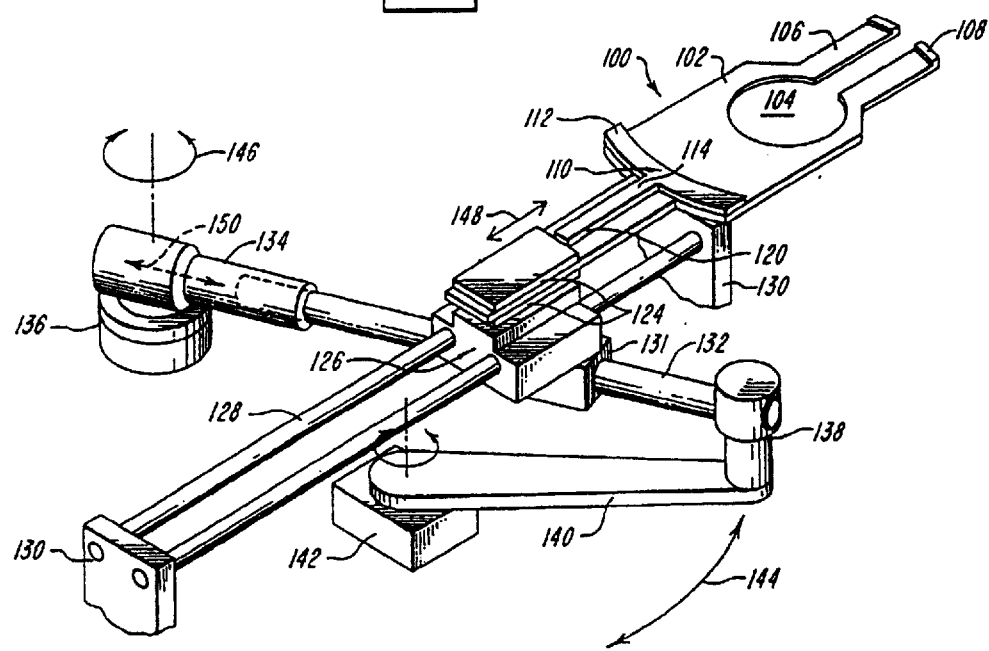
FIG. 5 is a perspective view of a first embodiment of the R, Θ movable wafer arm assembly of the multiple-processing and contamination-free plasma etching system according to the present invention.
Figure 8:
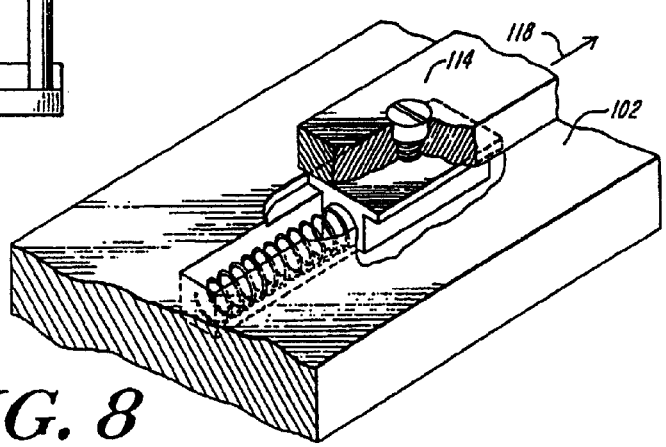
FIG. 8 is a partially broken-away and fragmentary isometric view illustrating a portion of the first embodiment of the R, Θ movable arm assembly of the multiple-processing and contamination-free plasma etching system of the present invention.

Referring now to FIGS. 2, 4, and 5, the wafer arm assembly 80 includes a wafer receiving and releasing paddle assembly generally designated 100. The paddle assembly 100 includes a platform 102 having a central opening generally designated 104 therethrough. The member 102 terminates in laterally spaced fingers 106 having wafer-periphery engaging upstanding flanges 108 integrally formed on the free ends thereof. A releasable abutment generally designated 110 having a bumper portion 112 and an integral tail portion 114 is mounted for sliding motion to the platform member 102. As best seen in FIG. 8, a coil spring 116 is mounted between the releasable abutment 110 and the member 102 which urges the bumper 112 in the direction of an arrow 118 so as to abut and therewith frictionally engage the periphery of a wafer, not shown, received between the bumper 112 and the flanges 108. The tail 114 includes a downwardly depending stop 120 to be described that is slidably received in an elongated aperture provided therefor in the platform member 102 that is cooperative with an upstanding abutment to be described to release the frictional wafer engagement as the arm reaches its position of maximum extension. The paddle assembly 100 is mounted between plates 124 to a carriage assembly generally designated 126 that is slidably mounted on linear bearings 128 that are fastened to end posts 130 upstanding from and fastened to the rotatable turntable 82.

The carriage 126 is controllably moved in either direction along the linear bearings 128 for loading and unloading wafers individually to and from the several plasma reactors 12 and the queuing station 18. A member 131 is pivotally mounted subjacent the carriage 126, which houses therein a linear bearing, not shown. A shaft 132 is slidably received through the linear bearing of the pivoting housing 131. One end of the shaft 132 is slidably mounted in a sleeve 134 that is mounted for rotary motion to the turntable 82 via a pivot bearing 136, and the other end of the shaft 132 is fastened to a needle bearing assembly 138 that is pivotally fastened to a crank arm 140 mounted for rotation with the shaft 92 of the R-drive motor 96 (FIG. 4) via a mounting coupling 142 fastened to the turntable 82.

Figure 6:
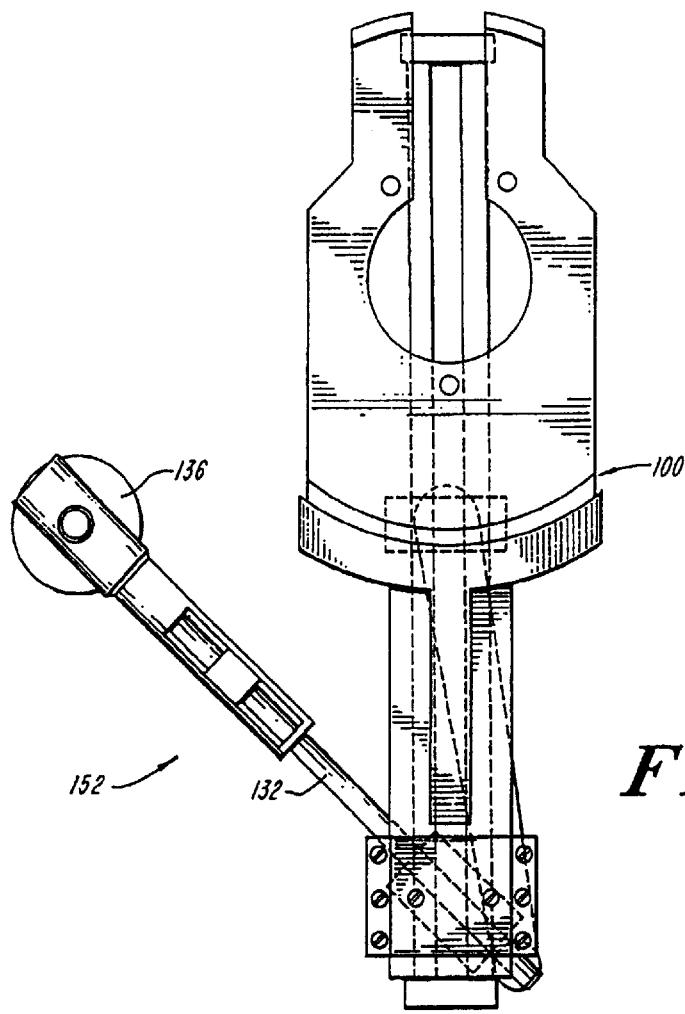
FIGS. 6 and 7 are plan views of the first embodiment of the R, Θ movable wafer arm assembly illustrating different movement positions of the R, Θ movable wafer arm assembly of the multiple-processing and contamination-free plasma etching system of the present invention.

With controlled rotation of the Θ-drive motor 88, the turntable 82 and therewith the paddle assembly 100 is rotated to that Θ coordinate that corresponds to any selected one of the angular locations of the plural plasma reaction chambers designated $\Theta_1$ through $\Theta_4$ in FIG. 2, and to that Θ coordinate that corresponds to the angular location of the wafer queuing station 14 designated $\Theta_5$ in FIG. 2. With the controlled rotation of the R-drive motor 96, the crank 140 races an arcuate path as illustrated by an arrow 144. The arm 132 therewith pivots on the pivot bearing 136 as shown by an arrow 146, and moves the carriage 126 linearly along the bearings 128 in a direction that corresponds to the sense of rotation of the X-drive motor as illustrated by an arrow 148. The arm is either more or less elongated relative to the coupling 136 as it is pivoted by the crank 140, and depending on the sense of the rotation, it slides within the sleeve 134 and within the housing 131 as illustrated by an arrow 150. When the crank 140 is turned to its maximum clockwise position, the paddle assembly 100 moves into its fully retracted position as illustrated generally at 152 in FIG. 6. With counterclockwise motion of the crank arm 140 the paddle moves along the R direction as illustrated generally at 154 in FIG. 7. As the paddle assembly 100 nears its fully extended position, close to the maximum allowed counterclockwise rotation of the R-drive motor, the stop 120 on the tail portion 110 abuts the confronting wall of the upstanding end post 130, such that with continued motion of the paddle along the R direction the bumper 110 draws away from the flanges 108 and thereby releases the frictional engagement of the wafer periphery. In the maximum extended position, then, the wafers are free to be loaded or unloaded to and from any selected plasma reactor 12 and/or are free for pick up or delivery back into the queuing station 14.

Figure 7:
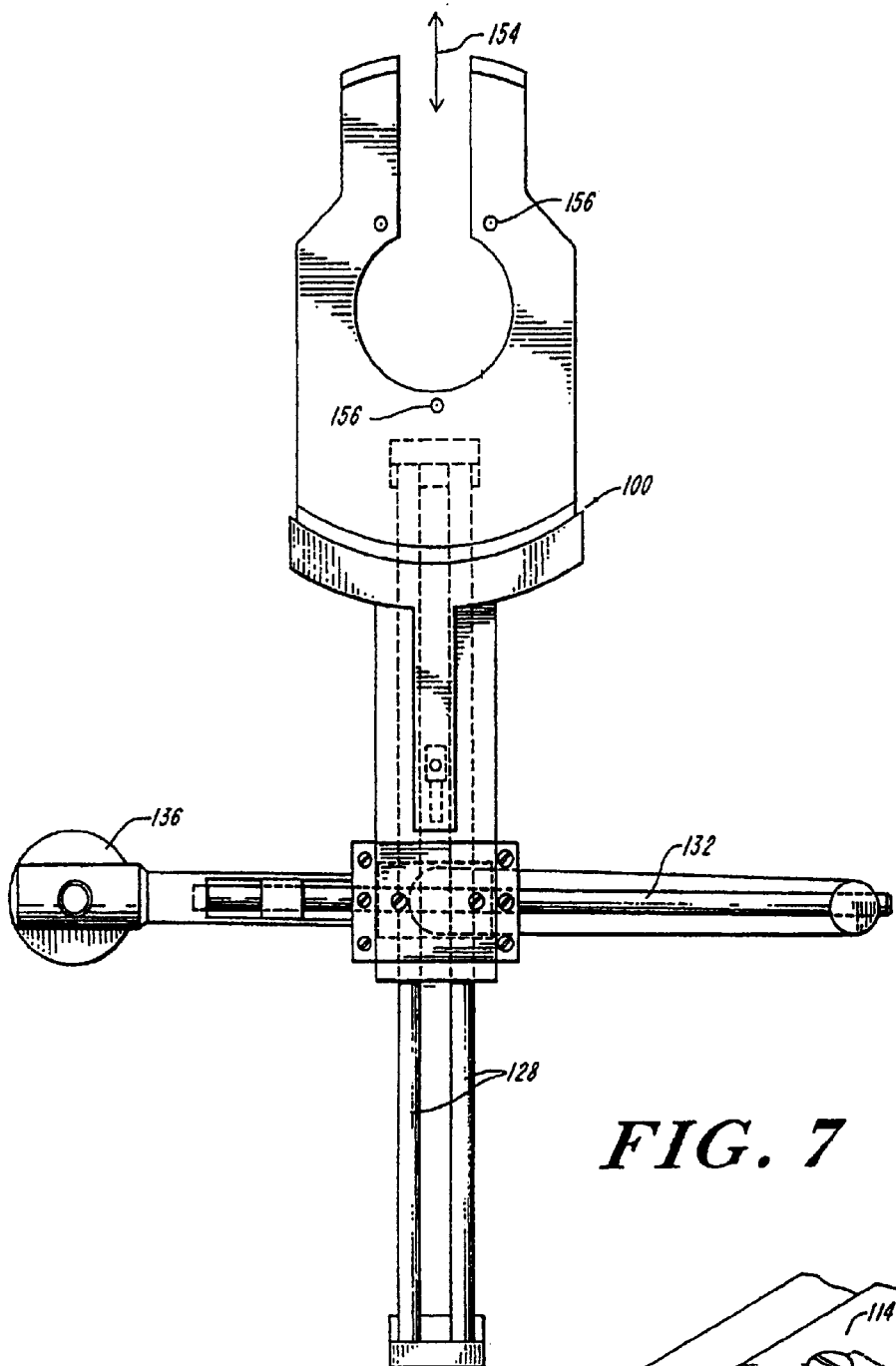

Contacts 156, preferably three in number, are mounted to the platform member 102 of the paddle assembly 100 as shown in FIG. 7. The contacts are operative in response to the presence of a supported wafer to provide a three-point signal indicative of whether or not the wafer is properly seated on the wafer transfer arm. The contacts preferably are formed on a printed circuit board, not shown, mounted to the paddle assembly 100. A different number thereof, or other sensing means may be utilized so long as an accurate indication of intended seating of individual wafers is provided.

Figure 9:
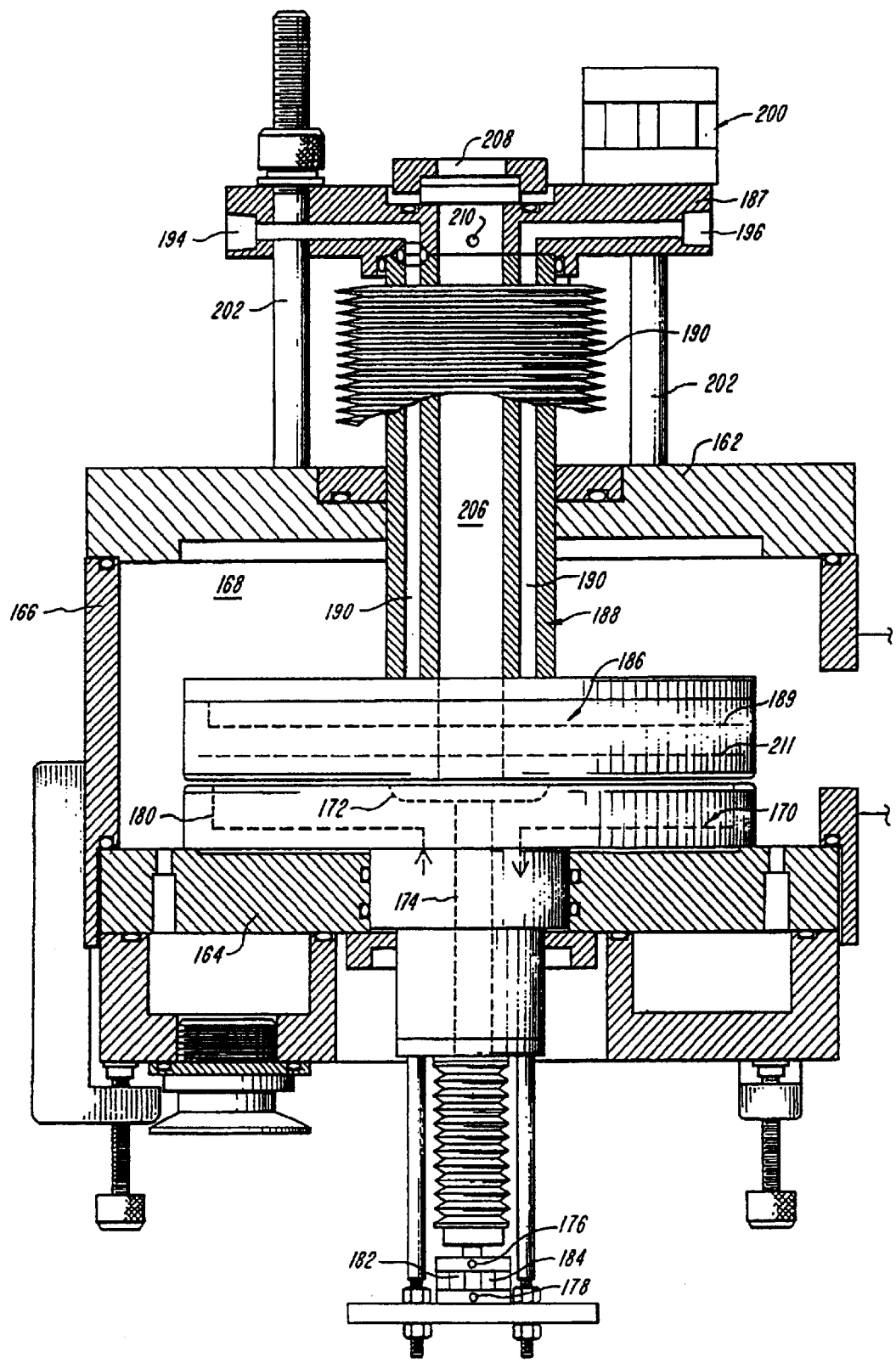
FIG. 9 is a partially pictorial and partially schematic side view illustrating a plasma reactor of the multiple-processing and contamination-free plasma etching system according to the present invention.

Referring now to FIG. 9, generally designated at 160 is a partially pictorial and partially schematic side view illustrating a plasma reactor of the multiple-processing and contamination-free plasma etching system according to the present invention. Each of the plasma reactors 160 includes a top plate 162, a spaced-apart bottom plate 164 and a cylindrical sidewall 166 cooperate to define a plasma chamber generally designated 168. A first electrode generally designated 170 is fastened to the bottom plate 164. A pedestal schematically illustrated dashed at 172 is slidably mounted centrally in the bottom electrode 170 for vertical motion with the shaft of a pnuematic cylinder schematically illustrated in dashed outline 174. As described more fully below, the pedestal 172 is cooperative with the paddle arm assembly to allow for removal and delivery of individual wafers into and out of the plasma chambers. The pedestal pnuematic cylinder 174 is driven by a controlled air supply, not shown, operatively coupled thereto via an air input port 176 and an air output port 178. As illustrated by dashed outline 180, a source of cooling liquid, not shown, is coupled to internal fluid flow passageways, not shown, provided through the interior of the bottom electrode 170 via input and output ports 182, 184 for removing the heat produced in the bottom electrode during plasma etching.

A top electrode generally designated 186 is fastened to a support shaft generally designated 188 that is slidably received through the top plate 162 in a vacuum-tight sealing engagement therewith as by a stainless steel vacuum bellows 190 fastened between the top plate 162 and a superadjacent shaft support plate 187. The top electrode 186 includes internal cooling/heating fluid flow passageways schematically illustrated in dashed outline 189 that are coupled via fluid flow conduits 190 disposed in the shaft 188 to a source, not shown, via a liquid input port 194 and an output port 196 provided in the plate assembly 187. A pneumatic actuator generally designated 200 having a ram 202 is mounted to the support plate assembly 187. With the ram 202 in its extended position, not shown, the plate 187 moves upwardly, and therewith the shaft 188 and electrode 186 move upwardly and away from the stationary bottom electrode 170. With the ram lowered as shown, micrometer adjustment posts 204 fastened to the plate assembly 187 bear against the top plate 162 and therewith support the top electrode 186 in an intended spaced-apart relation with the bottom electrode 170. The gap between the electrodes is adjustable by changing the length of the micrometer adjustment posts selectively. In the preferred embodiment, between 3/16 inch (5 mm) to 2 inches (50 mm) of gap adjustment is provided.

The shaft 188 has a hollow interior generally designated 206, and a laser window 208 is mounted across the hollow of the shaft 206. The beam of an external laser, not shown, passes through the window and hollow shaft for providing end-point determinations of the plasma etch state. Other end-point determination means, such as a lateral optical detector, may be employed as well without departing from the inventive concept. Reactant gas injection ports 210 are coupled via internal shaft conduits provided therefor, not shown, to a liquid-cooled showerhead gas manifold illustrated in dashed outline 211 in the upper electrode 186. Reactant gas is controllably released therefrom into the plasma reactor, and radio frequency power is applied in the plasma reaction chambers. In an alternative embodiment, the spacing between the electrodes can be preselected for each particular plasma process, and additional micrometers, in place of the pneumatic actuators 200, can advantageously be employed.

Figure 10:
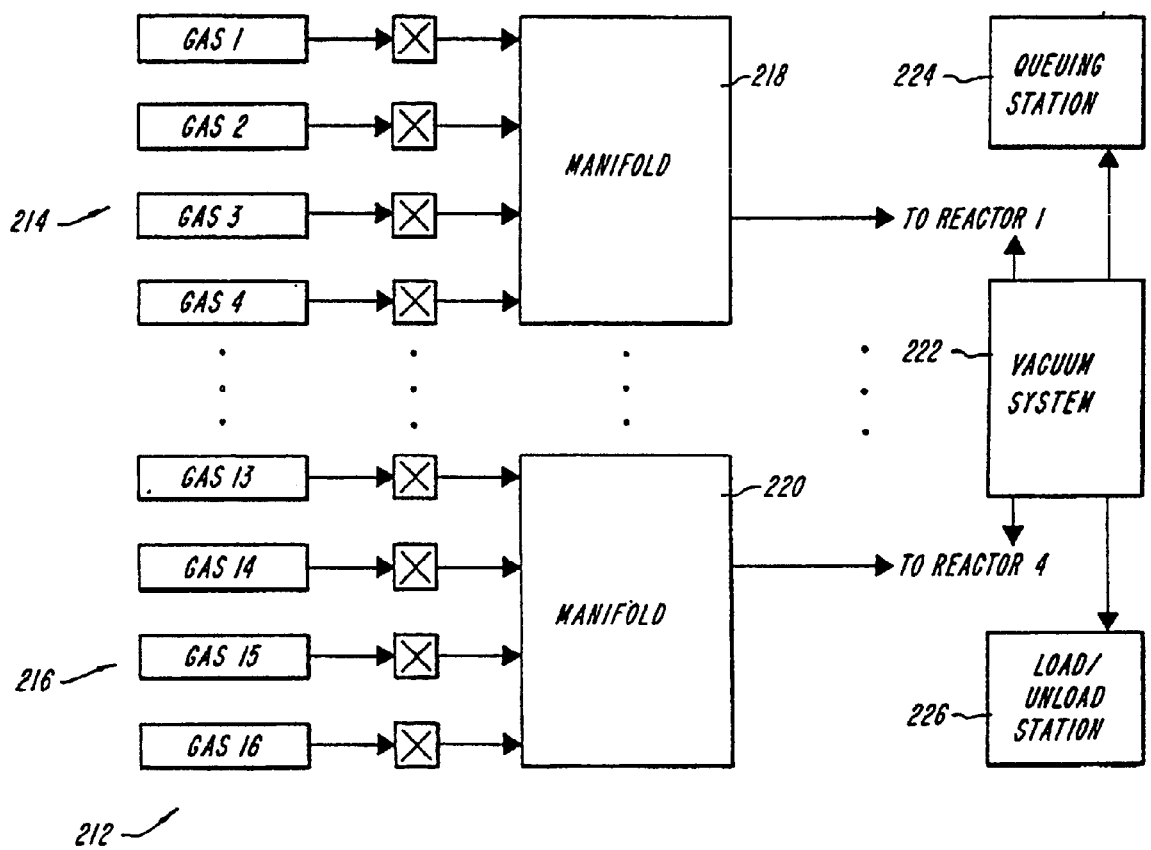
FIG. 10 is diagramatic view illustrating the several reactant injection systems and controlled vacuum system of the multiple-processing and contamination-free plasma etching system of the present invention.

Referring now to FIG. 10, generally designated at 212 is a schematic diagram illustrating the presently preferred gas injection and controlled vacuum systems. Preferably, four independently valved sources of gases are respectively connected to individual ones of the plasma vessels via corresponding ones of a plurality of gas manifolds, two banks of gas sources generally designated 214, 216 and two manifolds 218, 220 being specifically illustrated. A vacuum system 222 is operatively coupled in common to the plural plasma reactor chambers, to the queuing station 224, and to the load and unload island 226. The vacuum system controls the vacuum condition in the entire system, so that the wafers are free from possible contamination as the vacuum locks are severally opened and closed during single and multiple phase processing wafer transfer. It should be noted that while four plasma reactors are disclosed, a greater or a lesser number can be employed without departing from the inventive concept.

Figure 11A:
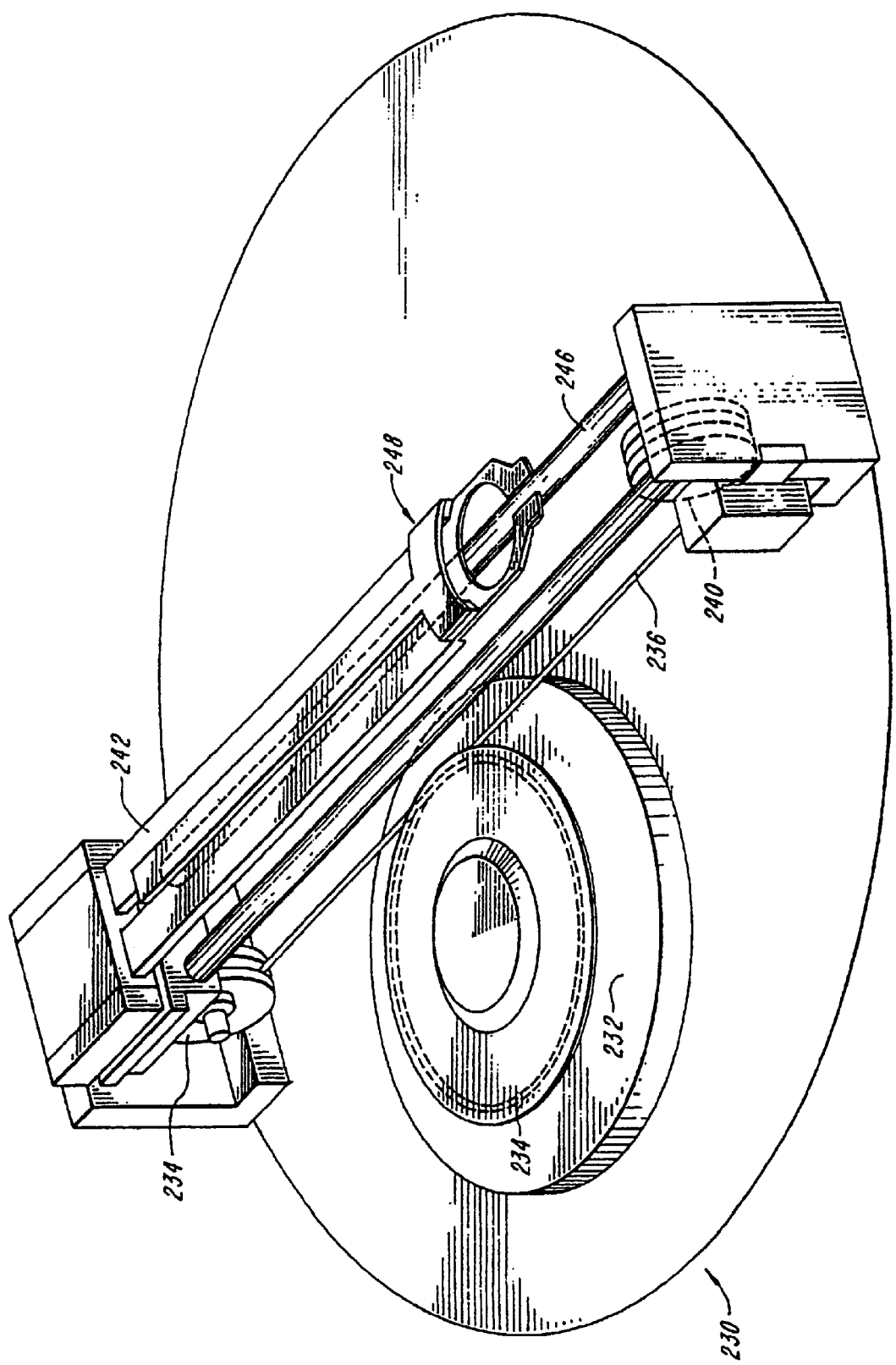
FIG. 11A is a perspective view and FIG. 11B is a sectional view of a second embodiment of the R, Θ movable arm assembly of the multiple-processing and contamination-free plasma etching system of the present invention.
Figure 11B:
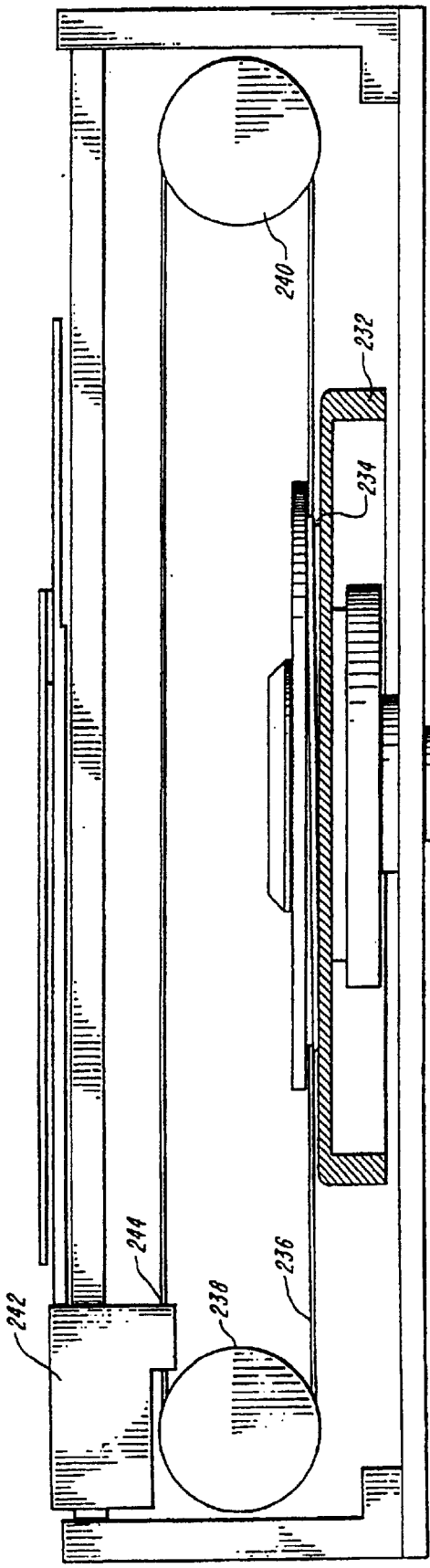
Figure 12:
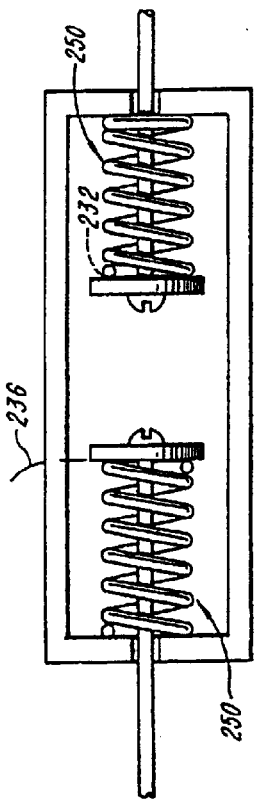
FIG. 12 is a perspective view of a portion of the second embodiment of the R, Θ movable wafer arm assembly of the multiple-processing and contamination-free plasma etching system according to the present invention.

Referring now to FIG. 11A, generally designated at 230 is a perspective view of an alternative embodiment of the X, Θ wafer arm assembly according to the present invention. The assembly 230 includes a pulley 232 mounted for rotation with the shaft of the Θ drive motor as best seen in FIG. 11B. The pulley 232 includes a grooved rim 234 around which a cable 236 is wrapped. The cable is drawn tangentally to the grooved rib 234 in opposing directions, and respectively wrapped over pulleys 238, 240 and tied to a slide 242, as best seen at 244 in FIG. 11B. With the angular rotation of the pulley 232, the slide 242 linearly moves along the the linear bearings 246. A wafer arm generally designated 248 is mounted for movement with the slide 242 such that the arm 248 is controllably extended and retracted in dependence on the angular position of the pulley 232. To provide constant tension in the cable 236, the ends of the cable preferably are terminated in the slide 242 against resilient biasing elements generally designated 250 in FIG. 12. The cable 236 as it stretches is pulled in a reverse direction by the resilient couplings 250 for maintaining its intended state.

During the plasma chamber load cycles, the Θ-drive motor turns the turntable of the R, Θ wafer arm assembly to the Θ coordinate of the queuing station in either embodiment of the R, Θ movable wafer arm assembly. The vacuum lock of the associated interface is released, and the arm is extended under the wafer in the addressed cassette slot position. The arm is then retracted back into the load and unload module, and the vacuum lock is restored. The R, Θ wafer arm assembly is then rotated to the Θ coordinate of the selected plasma reactor. The associated chamber door is then rotated to its open condition for providing access to the selected reaction chamber, and the upper electrode is raised. The wafer receiving arm is then extended in the R direction through the associated slot valve opening and into the selected reaction chamber. As it approaches the limit of its maximum radial travel, the depending stop flange on the wafer arm abuts the upstanding end post on the turntable and, with continued radial motion, the bumper withdraws thereby freeing the wafer from peripheral friction engagement. The central pedestal of the lower electrode is then controllably rasied by its pneumatic actuator, and therewith the wafer supported on the arm is elevated upwardly off of the wafer support platform. Thereafter, the wafer arm is retracted out of the plasma chamber though the open slot valve and back into the load and unload station. The pedestal is then controllably lowered. The wafer lowers therewith until the pedestal is in its retracted position and the wafer is supported on the surface of the lower electrode. The associated chamber door is then closed, and the upper electrode is lowered to that precise preselected gap that implements the particular plasma process being run. The intended reactants are then injected through the gas manifold of the upper electrode, and radio frequency power is applied. Whereupon, plasma etching of each single wafer is continued until the laser provides a signal indication that the proper end-point has been achieved. Thereafter, the RF power is turned-off, the vacuum lock is opened, and the above-described process is repeated, but in reverse order, for removing the wafer out of that plasma chamber and back into the load and unload station. The wafer can then be moved into another plasma reactor for a subsequent process in a two or more step processing mode, or back into the cassette in a one-step processing mode.

The load and unload module, queuing station, and plural reactors are operable in three basic modes, namely, where each reactor is simultaneously performing the same plasma reaction, where each plasma reactor is simultaneously performing two or more different plasma processes, and where the plasma reactors are severally being operated to provide multiple-step processing of single wafers before their return back to the queuing station. In each case, the wafers are transferred and processed in a controlled vacuum environment such that atmospheric exposure and handling induced contamination are wholly eliminated.

Figure 13:
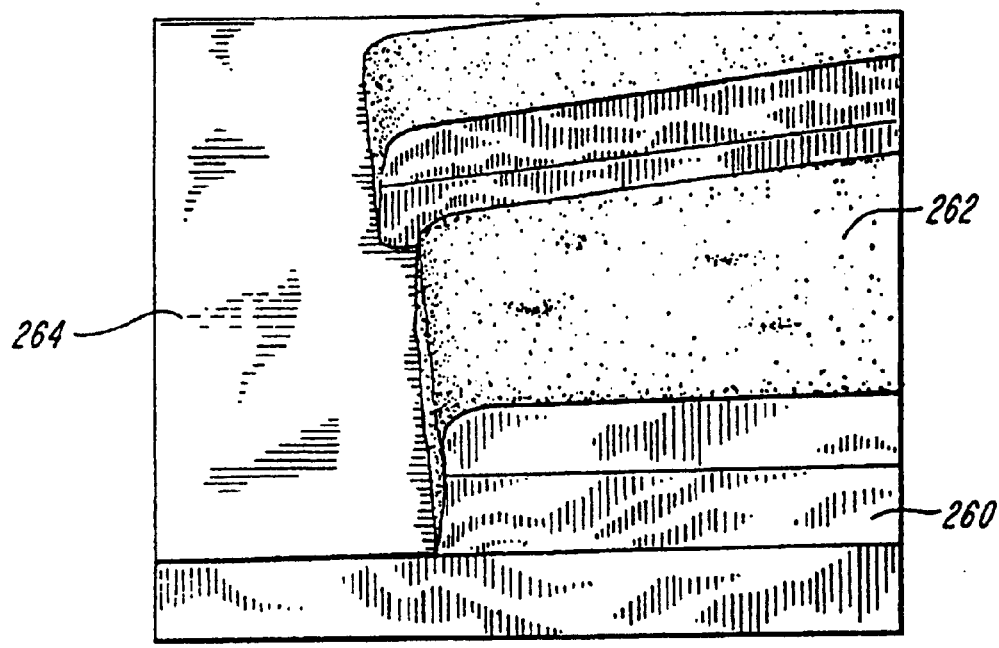
FIGS. 13–18 are SEM micrographs illustrating exemplary microstructures obtainable by the multiple-processing and contamination free plasma etching system according to the present invention.
Figure 14:
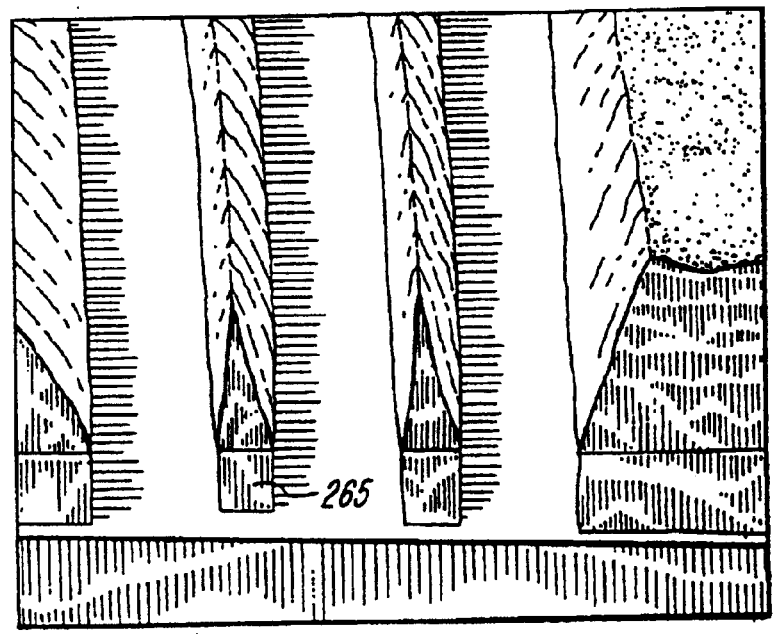
Figure 16:
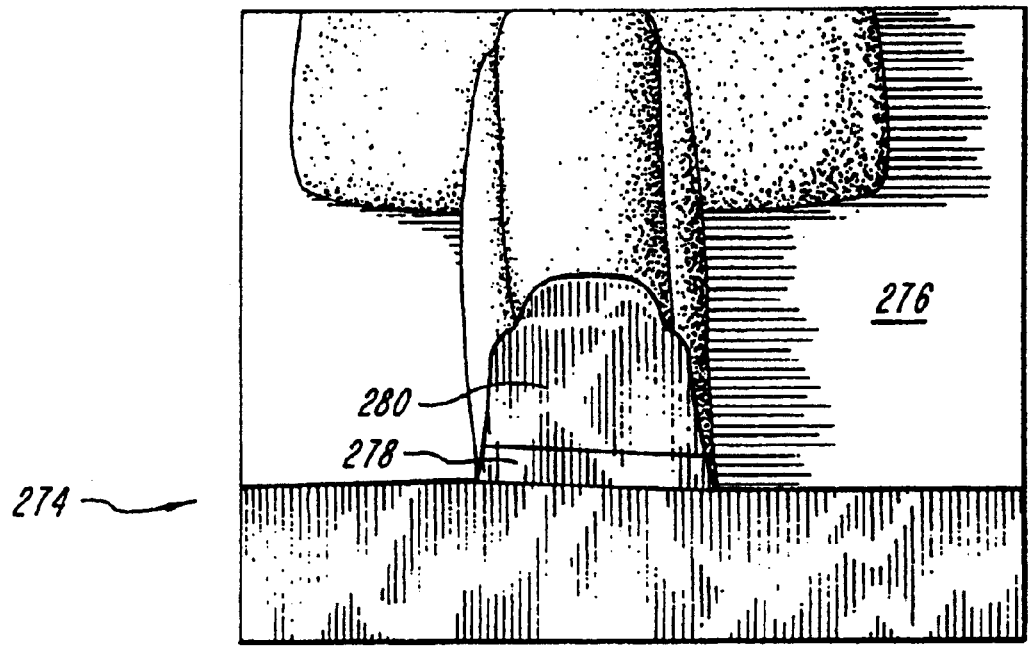
Figure 17:
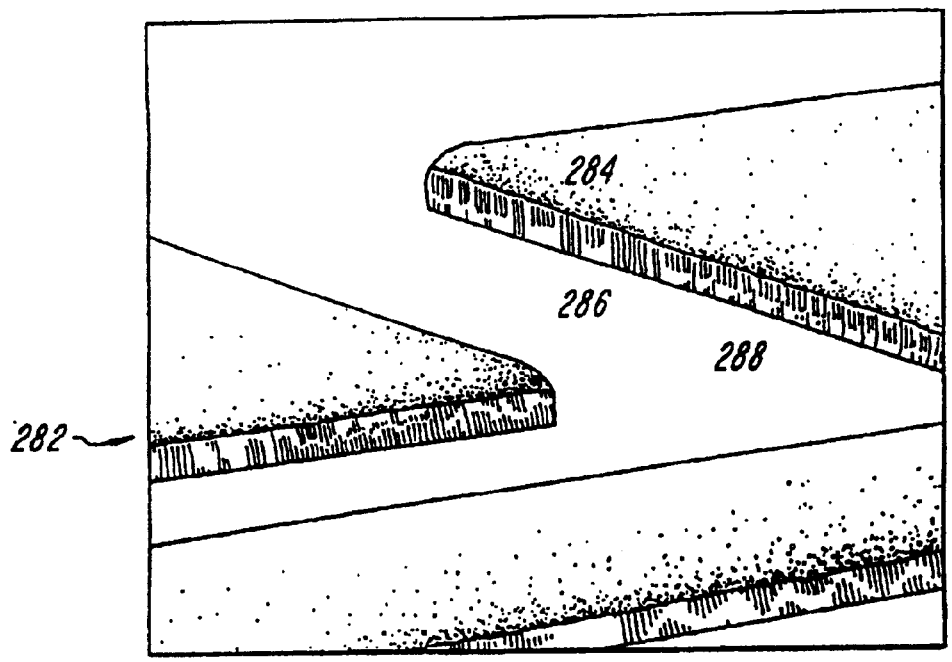
Figure 18:
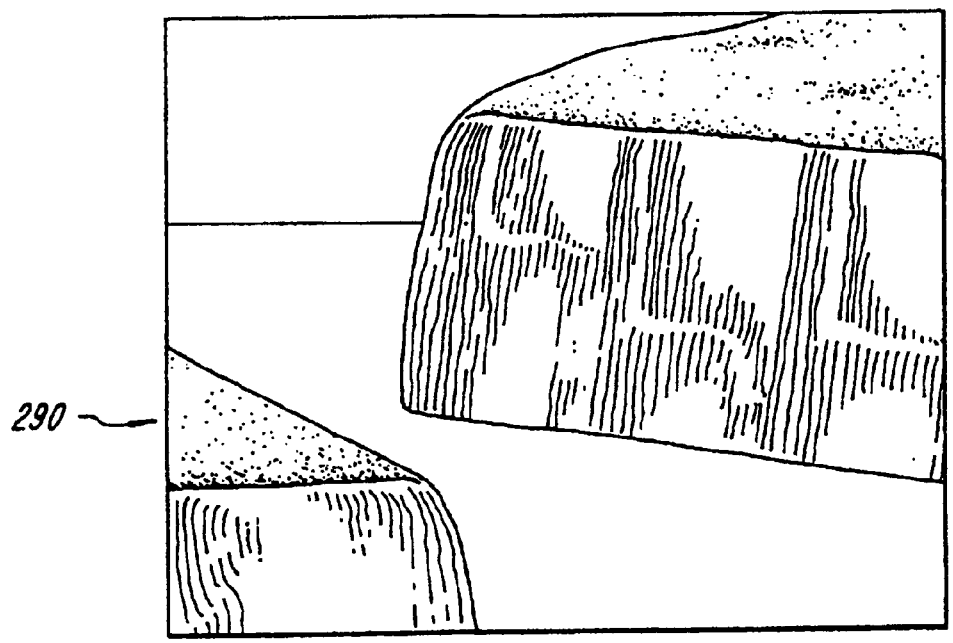

FIGS. 13–17 are scanning electron micrographs illustrating exemplary microstructures capable of being formed in a single-step process, and FIG. 18 is a scanning electron micrograph illustrating an exemplary microstructure capable of being fabricated in a double-step etch process. FIG. 13 shows generally at 260 polysilicon with an overlayed photoresist 262 on the surface of the silicon dioxide layer 264 of the wafer. For exemplary low-resistivity (12–30 ohms) doped polysilicon, $CCl_4$ at 20 sccn and He at 30 sccm are applied to the plasma reactor at a pressure of 100 mt and a power of 300 watts. The etch occurs for approximately 2½ minutes. As shown in FIG. 14 doped polysilicon 265 having a comparatively high resistivity (30–200 ohms per sq.) and having a slopped profile mask is illustrated. For the illustrated microstructure, $SF_6$ at 50 sccm and Freon 115 ($C_2ClF_5$) at 50 sccm are controllably injected into a plasma reactor at 150 mt pressure and a 100 watt power. After about 2½ minutes, the illustrated doped polysilicon microstructure is fabricated.

Figure 15:
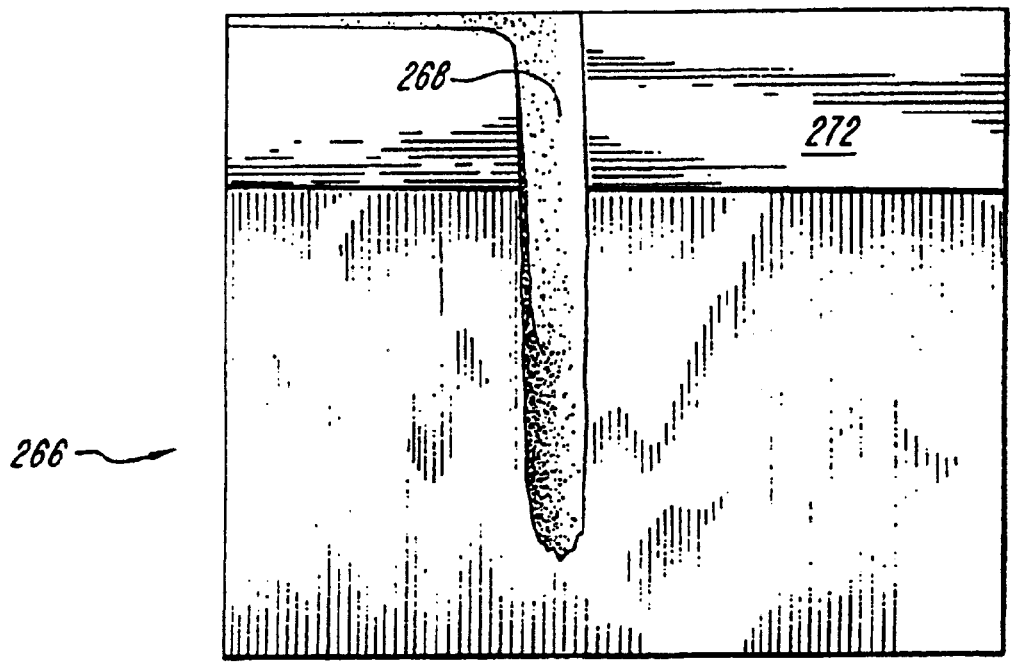

Referring now to FIG. 15, generally designated at 266 is a SEM illustrating an exemplary trench etch. The photoresist is removed, and a trench generally designated 268 is formed in the silicon 272 by injecting $BCl_3$ at 5 sccm and $Cl_2$ at 25 sccm into the plasma reactor at a 100 mt chamber pressure and at 750 watts power for about 20 minutes.

Referring now to FIG. 16, refractory silicide, TaSi/poly, is illustrated generally at 274. The silicon dioxide surface 276 is overlaid with a polysilicon layer 278 upon which is overlaid the TaSi/poly 280, over which overlaid is the photoresist. The microstructure is fabricated by injecting $CCl_4$ at 20 sccm and He at 30 sccm into a plasma reactor maintained at a chamber pressure of 80 mt and a radio frequency power of 300 watts for about 3½ minutes.

Referring now to FIG. 17, generally designated at 282 is another microstructure exemplary of the single-step structures capable of being fabricated by the contamination-free and multiple-processing plasma reactor of the present invention. As illustrated, a photoresist 284 is laid over an aluminum and silicon layer 286 which is overlaid via a TiW layer 288 on the wafer surface. The illustrated structure was fabricated by injecting $BCl_3$ at 50 sccm with $Cl_2$ at 15 sccm into the plasma reactor maintained at 125 mt chamber pressure and a 300 watt RF power for about 2½ to 3½ minutes.

Referring now to FIG. 18, generally designated at 290 is a silicon dioxide/poly/silicon dioxide/poly sandwich structure illustrating an exemplary two-step process. A poly layer designated poly 1 and an oxide layer designed oxide are formed after etching with $C_2F_6$ at 100 sccm at a 700 mt pressure and a 600 watt radio frequency power in a first chamber. Thereafter, the upper poly 2 layer and the oxide and an overlaid photoresist layer are formed by a separate step employing $CCl_4$ at 20 sccm and He at 30 sccm in a second reaction chamber maintained at a 100 militore chamber pressure and a 600 watt radio frequency power.

Many modifications of the presently disclosed invention will become apparent to those skilled in the art without departing from the scope of the appended claims.

What is claimed is:

1. A multiple-processing contamination-free wafer handling and processing system, comprising:

plural, wafer receiving and surface processing vessels each having a respective ingress and egress defining port that are arrayed about a predetermined spatial locus in such a way that the several ports thereof are accessible from a single location spaced from the several ports;

a wafer queuing station spaced with the plural vessels along the same predetermined spatial locus defining a wafer access port accessible from said single location;

plural valves individually coupled to corresponding ones of said plural, vessel ingress and egress ports and to said wafer queuing station wafer access port;

transfer means disposed at said single location and cooperative with corresponding ones of said plural valves for moving wafers from and to said wafer access port of said queuing station from and to selected ones of said wafer receiving and surface processing vessels through the associated one of said ingress and egress ports thereof;

a substantially centrally located wafer support within each said surface processing vessel for supporting wafers transferred to said vessels by said transfer means; and processor means for controlling said vessels, said transfer means and said valves to provide selectability between single-step processing and multi-step processing of wafers in said queuing station in one or more of said vessels.

2. The system of claim 1, wherein said transfer means includes a wafer arm assembly controllably translated through said valves into and out of any of said processing vessels and said queuing station and having a paddle assembly attached thereto for receiving a wafer on an upper surface thereof and being translatable by said wafer arm assembly through said valves.

3. The system of claim 1, wherein said plural processing vessels comprise at least one plasma reactor.

4. The system of claim 1, further comprising a central chamber including said single location, said valves selectively communicating said central chamber to said plural processing vessels and to said wafer queuing station, wherein said central chamber contains no means for processing said wafers.

5. A multiple-processing and contamination-free substrate surface processing system, comprising:

plural, single-substrate substrate surface processing vessels each having a respective ingress and egress defining port that are arrayed about a predetermined spatial locus in such a way that the several ports thereof are accessible from a single location spaced from the several ports;

a substrate queuing station spaced with the plural vessels along the same predetermined spatial locus defining a substrate access port accessible from said single location;

plural valves individually coupled to corresponding ones of said plural, single-substrate substrate surface processing vessel ingress and egress ports and to said substrate queuing station substrate access port;

single-substrate transfer means disposed at said single location and cooperative with corresponding ones of said plural valves for moving substrates from and to said substrate access port of said queuing station from and to selected ones of said single-substrate substrate surface processing vessels through the associated one of said ingress and egress ports thereof;

a substantially centrally located substrate support within each said surface processing vessels for supporting one of said substrates on an upper surface thereof transferred to said upper surface by said transfer means; and processor means coupled to said vessels, said transfer means and said valves for providing selectability between single-step and multiple-step substrate surface processing of plural substrates, in accordance with commands, in one or more of said substrate surface processing vessels.

6. The system of claim 5, wherein said transfer means includes a substrate arm assembly controllably translated through said valves into and out of any of said processing vessels and said queuing station and having a paddle assembly attached thereto for receiving one of said substrates on an upper surface thereof and being translatable by said substrate arm assembly through said valves to transfer said one substrate from said upper surface of said paddle assembly to said upper surface of said substrate support.

7. The system of claim 5, wherein said plural processing vessels comprise at least one plasma reactor.

8. The system of claim 5, further comprising a central transfer chamber including said single location, said valves selectively communicating said central transfer chamber to said plural processing vessels and to said substrate queuing station, wherein said central chamber contains no means for processing said substrates.

9. A multiple-processing and contamination-free substrate surface processing system, comprising:

plural, single-substrate substrate surface processing vessels each having an ingress and egress defining port that are arrayed about a predetermined spatial locus in such a way that the several ports thereof are accessible from a single location spaced from the several ports;

a substrate queuing station spaced with the plural vessels along the same predetermined spatial locus defining a substrate access port accessible from said single location;

plural valve means individually coupled to corresponding ones of said plural, single-substrate substrate surface processing vessel ingress and egress ports and to said substrate queuing station substrate access port;

single-substrate transfer means disposed at said single location and cooperative with corresponding ones of said plural valve means for moving substrates from and to said substrate access port of said queuing station from and to selected ones of said single-substrate substrate surface processing vessels through the associated one of said ingress and egress ports thereof, said transfer means including a wafer arm assembly controllably translatable through said valve means into and out of any of said processing vessels and said queuing station and having a paddle assembly attached thereto for receiving one of said substrates on an upper surface thereof; and a substantially centrally located substrate support within each said surface processing vessel for supporting on an upper surface thereof one of said substrates transferred to said upper surface of said substrate support from said upper surface of said paddle assembly by said transfer means.

10. The system of claim 9 further comprising a central chamber including said single location, said valves selectively communicating said central chamber to said plural processing vessels and said wafer queuing station, wherein said central chamber contains no means for processing wafers.

11. A substrate processing system, comprising:

plural single-substrate substrate surface processing vessels each having an ingress and egress defining port that are arrayed about a predetermined spatial locus;

a substrate queuing station spaced with the plural vessels along the same predetermined spatial locus defining a substrate access port;

a substrate load/unload module located concentrically within said processing vessels and said queuing station;

plural valves individually coupled to said load/unload module and to corresponding ones of said plural vessel ingress and egress ports and said substrate access port;

a substrate arm assembly located in and rotatable about an axis within said load/unload module and having a paddle for receiving on an upper surface thereof a substrate and being extensible into any of said processing stations and said queuing station; and a substantially centrally located substrate support within each said processing vessel for supporting on an upper surface thereof one of said substrates transferred to said vessels from said upper surface of said paddle by said arm assembly.

12. The processing system of claim 11, wherein said processing vessels are all plasma reactors.

13. The system of claim 11 wherein said substrate load/unload module includes a chamber having walls accommodating said plural valves, wherein said chamber contains no means for processing said substrates.

* * * * *